METHOD FOR MAKING CADMIUM SULPHIDE FIELD EFFECT TRANSISTOR

Filed April 3, 1963

INVENTORS
James E. Kauppila &
BY Robert R. Bockemuehl
Robert E. Fowler
ATTORNEY

3,320,651
METHOD FOR MAKING CADMIUM SULPHIDE FIELD EFFECT TRANSISTOR

James E. Kauppila, Royal Oak, and Robert R. Bockemuehl, Bloomfield Hills, Mich., assignors to General Motors Corporation, Detroit, Mich., a corporation of Delaware Filed Apr. 3, 1963, Ser. No. 270,285
3 Claims. (Cl. 29—25.3)

This invention relates to an improved field effect transistor and to the process for fabricating the same.

A field effect transistor or unipolar transistor is the most analogous form of transistor to electron tube construction. It utilizes charge carriers of only one polarity, the current flowing therethrough from one end to the other and being modulated or controlled in its flow by an intermediate electrode which operates much in the manner of a tube grid. The contact where electrons are injected into the body is called the source electrode and that from which they emerge, the drain. These are ohmic contacts to the conductive body. The control contact is referred to as the gate and forms a rectifying junction with the conductive body. One object of such construction is to obtain as much control of the current flow through the conducting body by the gate as possible, in other words, get good gain.

One way in which to provide satisfactory control by voltage applied to the gate electrode is to make the conducting body as thin as possible. This can most easily be accomplished by converting a thin layer of an insulator or semiconductor body to the proper desired conductivity by diffusing impurities into the same. Most of the field effect transistors heretofore fabricated have been formed of silicon or germanium because they were higher mobility materials. If the device can be made sufficiently thin, low mobility materials can be used, such as cadmium sulphide or cadmium selenide which provide other advantages.

It is an object in making this invention to provide an improved field effect transistor using low mobility, high energy gap material.

It is a further object to provide a process for making an improved field effect transistor of low mobility, high energy gap material.

It is a further object to provide a field effect transistor of cadmium sulphide or cadmium selenide having adequate gain and being easily fabricated.

With these and other objects in view which will become apparent as the specification proceeds, our invention will be best understood by reference to the following specification and claims and the illustrations in the accompanying drawings, in which:

Figure 1:
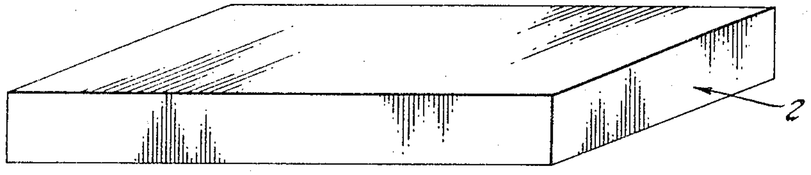
FIGURE 1 is a perspective view of a wafer of low mobility, high energy gap material.
Figure 2:
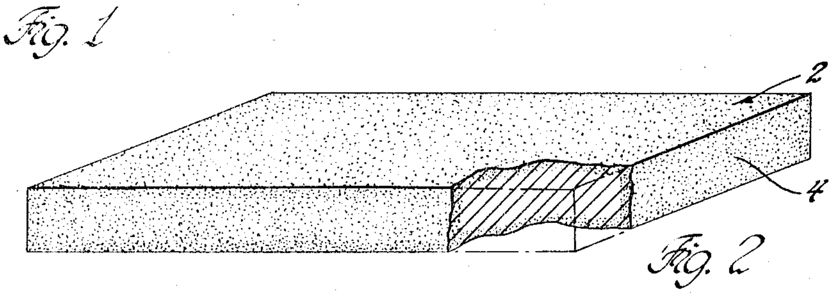
FIG. 2 is a sectional view through the wafer after it has been diffused to alter the conductivity of a thin surface layer.

In the formation of a field effect transistor according to our invention, a small wafer of semiconductor material 2, FIG. 1, is first selected. This may be any of a group of low mobility materials such as cadmium sulphide. The wafer shown in FIG. 1 is enlarged for purposes of simplified illustration being actually only approximately one-eighth inch wide by perhaps one-quarter inch long. This material is substantially an electrical insulating material at normal temperatures in the dark. After the wafer or slab has been selected it is placed in a furnace to which controlled vapor bearing a desired impurity may be introduced. While a large number of different substances may be used, as exemplary, hydrogen atmosphere containing indium vapor may be introduced to the furnace while the wafer is housed therein to contaminate and convert a thin surface layer to suitable conductivity. The temperature in the furnace for such diffusion may be raised to 550° C. and if this is maintained for about two minutes a thin conductive surface layer will be produced. This layer 4 (FIG. 2), of course, covers all surfaces of the wafer since they are all exposed.

Figure 3:
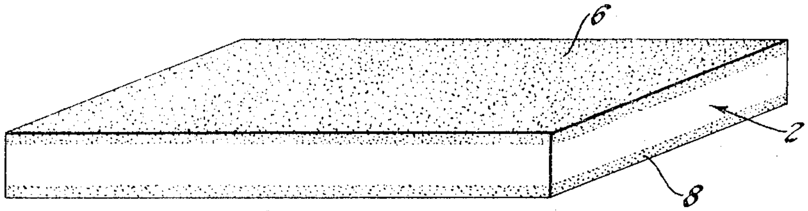
FIG. 3 shows the same wafer as shown in FIG. 2 with the four edges removed.
Figure 4:
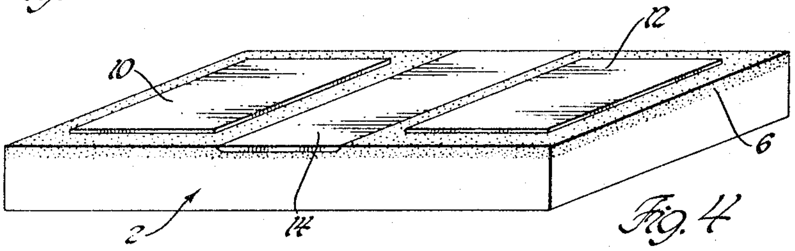
FIG. 4 is a perspective view of the resultant wafer with the ohmic and rectified contacts applied; and, FIG. 5 is an enlarged partial section through said wafer illustrating electrical connections thereto.

The next step is to cut or etch away the edges until the conductive layer on each edge is removed therefrom. This now leaves a thin conductive layer, such as 6 or 8, on opposite faces of the wafer as shown in FIG. 3. Only one such thin surface is necessary to form a field effect transistor. Either surface 6 or 8 may be used and the other removed. The wafer 2 with a thin conductive layer 6 on one side then has applied to that surface two spaced ohmic contacts 10 and 12 and an intermediate rectifying contact 14. The ohmic electrodes 10 and 12 may be formed on the conductive surface 6 by deposition of suitable contact material through shielding means to produce the desired areas. This deposition may be by vacuum, electro-deposition or any other well known means of depositing thin metal layers on metallic surfaces. After the ohmic electrodes 10 and 12 have been formed, the rectifying area 14 between the two electrodes is formed by again depositing a thin metal sheet in that area. This metal sheet must include an impurity contaminant of a type for converting the material of the thin surface 6 toward the opposite type conductivity. The actual material deposition may be of the same form as that used to deposit the ohmic electrodes. It is not necessary to apply heat to the electrodes 10, 12 and 14 but application of heat thereto will in some instances increase conductivity. After the layer or sheet 14 has been deposited a potential barrier will exist between 14 and 6 forming a rectifying junction.

Figure 5:
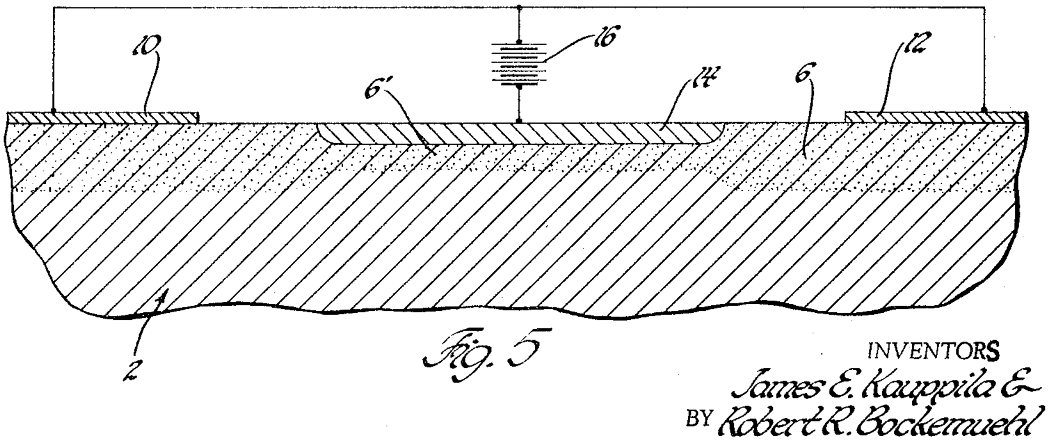

As mentioned earlier in the specification, it is desirable to have the conductive layer 6 as thin as possible. Originally this layer is diffused in as short a distance as is practical. However, it has been found that through proper treatment after the electrodes have all been applied that the thickness of the conductive layer 6 can be decreased. This is accomplished by applying a bias to the rectifying junction 14 as shown in FIG. 5 and raising the temperature of the composite body to increase the ionic drift velocity. With the voltage supply 16 connected as shown in FIG. 5 across the electrodes, negatively charged electrons are depleted from the conductive region 6′ directly under the rectifying junction 14. The ionized donor impurities remain and constitute a positive space charge. These positively charged donors have finite mobility through the semiconductor lattice and tend to drift toward the negative potential electrode 14. Holding the voltage 16 and elevated temperature, the donor drift velocity is sufficient to cause the conductive region 6′ to become thinner under the electrode 14 in a relatively short time. In addition, simultaneously the material of the electrode 14 diffuses into the region 6′. This introduces an increase in the reverse bias resistance of the junction 14–6′. The same method can, of course, be utilized if material of opposite conductivity characteristics is utilized, then opposite polarities are used.

It may be desirable to make the thickness of the region 6′ nonuniform beneath the electrode 14. This can be accomplished by adding a suitable source of voltage in series with the connections to ohmic contacts 10 and 12. The resultant device is a field effect transistor in which current flows from ohmic contact 10 through conductive film layer and necked down area 6' to ohmic electrode 12. This flow of current may be modulated by applying a biasing voltage to rectifying electrode 14. It will be seen that such action is quite analogous to the operation of an electron tube in which the current flow therethrough from filament to plate may be modulated by the potential applied to a control grid.

What is claimed is:

1. In a method of fabricating a semiconductor device, the steps of obtaining a wafer of high energy gap material which is normally considered to be an insulator, diffusing into at least one surface of said wafer an impurity to vary the conductivity of a thin layer thereof, producing a conductive surface and convert the same to a usable value, applying spaced ohmic metallic electrodes to said conductive surface by which the device may be connected into an electrical circuit, applying a rectifying barrier electrode to the conductive surface between the spaced ohmic metallic electrodes to act as a control electrode and simultaneously applying heat and a voltage across the rectifying barrier electrode and the ohmic metallic electrodes to increase ionic drift velocity, depleting the charged electrons under the rectifying barrier electrode to, in effect, cause that conductive region of the wafer thereunder to become thinner and improve the control characteristics.

2. In a method of fabricating a field effect transistor, the steps of selecting a thin flat wafer of high energy gap material, placing the same in an atmosphere of an impurity material and raising the temperature to diffuse the impurity material into the surface and convert a thin layer to be conductive, applying a plurality of spaced ohmic contacts to the conductive surface of the wafer to act as source and drain electrodes, applying a rectifying junction electrode to the same surface between the spaced ohmic contacts to act as a gate electrode and simultaneously raising the ambient temperature and producing a voltage across the spaced ohmic contacts and the rectifying junction electrode to effect a thinning of the conductive surface layer of the wafer under the rectifying junction electrode to increase the efficiency of operation as a field effect transistor.

3. In a method of fabricating a field effect transistor, the steps of obtaining a thin wafer of cadmium sulphide, placing the same in a furnace at an elevated temperature in a hydrogen-indium vapor to diffuse the indium a short distance into the wafer and produce a thin conductive surface layer, applying a plurality of spaced ohmic electrodes to one surface of said resultant diffused wafer to act as source and drain electrodes, applying a rectifying junction barrier to said one surface between said spaced ohmic electrodes to act as a gate electrode and simultaneously heating and applying a voltage across the spaced ohmic and rectifying barrier electrodes to effect a thinning of the conductive layer beneath the rectifying barrier electrode to increase the efficiency of the field effect transistor operation.

References Cited by the Examiner

UNITED STATES PATENTS

| | | | |
|---|---|---|---|
| 2,932,878 | 4/1960 | Jacobs | 29—25.3 |
| 3,152,294 | 10/1964 | Siebertz et al. | 317—235 |
| 3,176,153 | 3/1965 | Bejat et al. | 307—88.5 |
| 3,188,244 | 6/1965 | Hutchins et al. | 148—1.5 |
| 3,204,161 | 8/1965 | Witt | 317—235 |

JOHN W. HUCKERT, *Primary Examiner.*

J. D. KALLAM, R. SANDLER, *Assistant Examiners.*